United States Patent
Cooper et al.

(10) Patent No.: US 7,543,954 B2
(45) Date of Patent: Jun. 9, 2009

(54) LARGE AREA EL LAMP

(75) Inventors: Anne Marie Cooper, Apache Junction, AZ (US); David G. Pires, Phoenix, AZ (US)

(73) Assignee: World Properties, Inc., Lincolnwood, IL (US)

( * ) Notice: Subject to any disclaimer, the term of this patent is extended or adjusted under 35 U.S.C. 154(b) by 604 days.

(21) Appl. No.: 10/941,381

(22) Filed: Sep. 15, 2004

(65) Prior Publication Data

US 2006/0056168 A1    Mar. 16, 2006

(51) Int. Cl.
*F21S 4/00* (2006.01)

(52) U.S. Cl. .................. 362/219; 362/84; 362/225; 362/34; 313/509; 313/500; 313/504; 313/506; 445/24

(58) Field of Classification Search ............... 362/219, 362/84, 225, 34; 313/509, 500, 504, 506; 445/24
See application file for complete search history.

(56) References Cited

U.S. PATENT DOCUMENTS

| | | | | |
|---|---|---|---|---|
| 2,910,792 A | | 11/1959 | Pfaff, Jr. ...................... | 40/582 |
| 2,964,587 A | * | 12/1960 | Minot ..................... | 174/117 A |
| 3,161,797 A | * | 12/1964 | Butler et al. ................ | 313/512 |
| 4,138,620 A | * | 2/1979 | Dickson ........................ | 313/1 |
| 4,460,804 A | * | 7/1984 | Svejkovsky ............. | 174/117 A |
| 5,416,622 A | * | 5/1995 | Engfer et al. ............... | 349/149 |

* cited by examiner

*Primary Examiner*—Sandra L O'Shea
*Assistant Examiner*—Jessica L. McMillan
(74) *Attorney, Agent, or Firm*—Paul F. Wille

(57) ABSTRACT

The unlit margin of a first EL lamp is covered by the lit edge of a second EL lamp to provide a substantially seamless lit area. The lamps are joined mechanically. The EL lamps are connected in parallel electrically by conductive tape overlying at least a portion of the bus bars of the lamps. A plurality of lamps can be joined together to provide an EL lamp substantially larger than obtainable by other means.

2 Claims, 2 Drawing Sheets

LARGE AREA EL LAMP

BACKGROUND

This invention relates to electroluminescent (EL) lamps and, in particular, to large area EL lamps. As used herein, an EL "panel" is a single substrate including one or more luminous areas, wherein each luminous area is an EL "lamp".

An EL lamp is essentially a capacitor having a dielectric layer between two conductive electrodes, one of which is transparent. Either the dielectric layer includes a phosphor powder or there is a separate layer of phosphor powder between the dielectric layer and one electrode. The phosphor powder radiates light in the presence of a strong electric field, using very little current.

A modern (post-1990) EL lamp typically includes a transparent substrate of polyester (polyethylene terephthalate, PET) or polycarbonate having a thickness of about 7.0 mils (0.178 mm). A transparent, front electrode of indium tin oxide (ITO) is vacuum deposited onto the substrate to a thickness of 1000 Å or so. A phosphor layer is screen-printed over the front electrode and a dielectric layer is screen-printed over the phosphor layer. A rear electrode is screen-printed over the dielectric layer. A rear insulation layer may be added in the form of a screen-printed layer or a tape with an adhesive coating.

The inks used for screen-printing include a binder, a solvent, and a filler, wherein the filler determines the nature of the printed layer. A typical solvent is dimethylacetamide (DMAC). The binder is typically a fluoropolymer such as polyvinylidene fluoride/hexafluoropropylene (PVDF/HFP), polyester, vinyl, or epoxy. A phosphor layer is typically screen-printed from a slurry (ink) containing a solvent, a binder, and doped zinc sulphide phosphor particles, such as described in U.S. Pat. No. 5,418,062 (Budd). A dielectric layer is typically screen-printed from a slurry (ink) containing a solvent, a binder, and barium titanate ($BaTiO_3$) particles.

A rear (opaque) electrode is typically screen-printed from a slurry (ink) containing a solvent, a binder, and conductive particles such as silver, carbon or graphite, or mixtures thereof. A bus bar of conductive ink is typically deposited on the electrodes to reduce the voltage drop across larger lamps. When the solvent and binder for each layer are chemically the same or similar, there is chemical compatibility and good adhesion between adjoining layers. The respective layers are applied, e.g. by screen-printing or roll coating, and then cured or dried.

Most EL lamps are made in batches by screen-printing rather than being made continuously, e.g. by roll coating. As a result, the size of a lamp is limited to the size of the screen, typically eighteen by twenty-four inches (46×61 cm.). There are many applications wherein larger lamps are desired, in signage for example. What is needed is a substantially seamless, large luminous area for back lighting graphics or transparencies. "Large" is used in the sense of the EL lamp being larger than available equipment can make. Even roll coated lamps have finite width and manufacturing equipment does not scale. That is, doubling the width of a roll coated lamp is not simply a matter of doubling the width of the rolls. Uniformity of the layers becomes a significant issue as width increases, for example.

It is known in the art to provide luminous letters on a common support with the letters interconnected by cable; see for example U.S. Pat. No. 2,910,792 (Pfaff, Jr.).

In view of the foregoing, it is therefore an object of the invention to provide a substantially seamless, large EL panel.

Another object of the invention is to provide a screen printed EL lamp having an area larger than the work area of a single screen printer.

A further object of the invention is to provide a method for attaching one EL lamp to another.

SUMMARY OF THE INVENTION

The foregoing objects are achieved in this invention in which the unlit margin of a first EL lamp is covered by the lit edge of a second EL lamp to provide a substantially seamless lit area. The lamps are joined mechanically at least along the margin. The EL lamps are connected in parallel electrically by conductive tape overlying at least a portion of the bus bars of the lamps. A plurality of lamps can be joined together to provide an EL lamp substantially larger than obtainable by other means.

BRIEF DESCRIPTION OF THE DRAWINGS

A more complete understanding of the invention can be obtained by considering the following detailed description in conjunction with the accompanying drawings, in which.

DETAILED DESCRIPTION OF THE INVENTION

Figure 1:
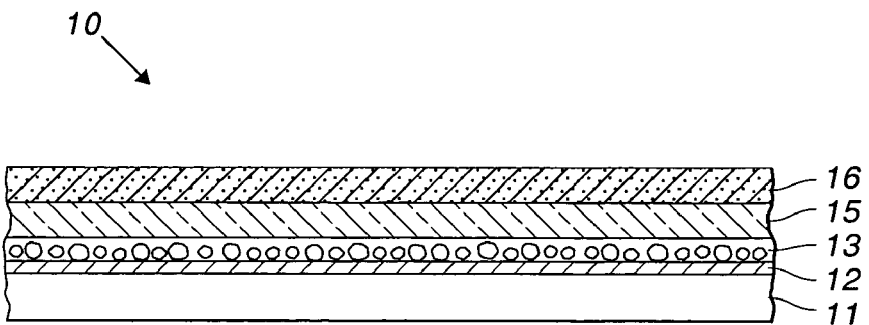
FIG. 1 is a cross-section of an EL lamp.

FIG. 1 is a cross-section of an EL panel suitable for use in the invention. The several layers are not shown in proportion or to scale. Lamp 10 includes transparent substrate 11 and transparent electrode 12, typically indium tin oxide, overlying substrate 11. Phosphor layer 13 overlies electrode 12 and dielectric layer 15 overlies the phosphor layer. The phosphor layer and the dielectric layer can be combined into a single layer in some applications. Overlying dielectric layer 15 is rear electrode 16 containing conductive particles such as silver or carbon in a resin binder.

Figure 2:
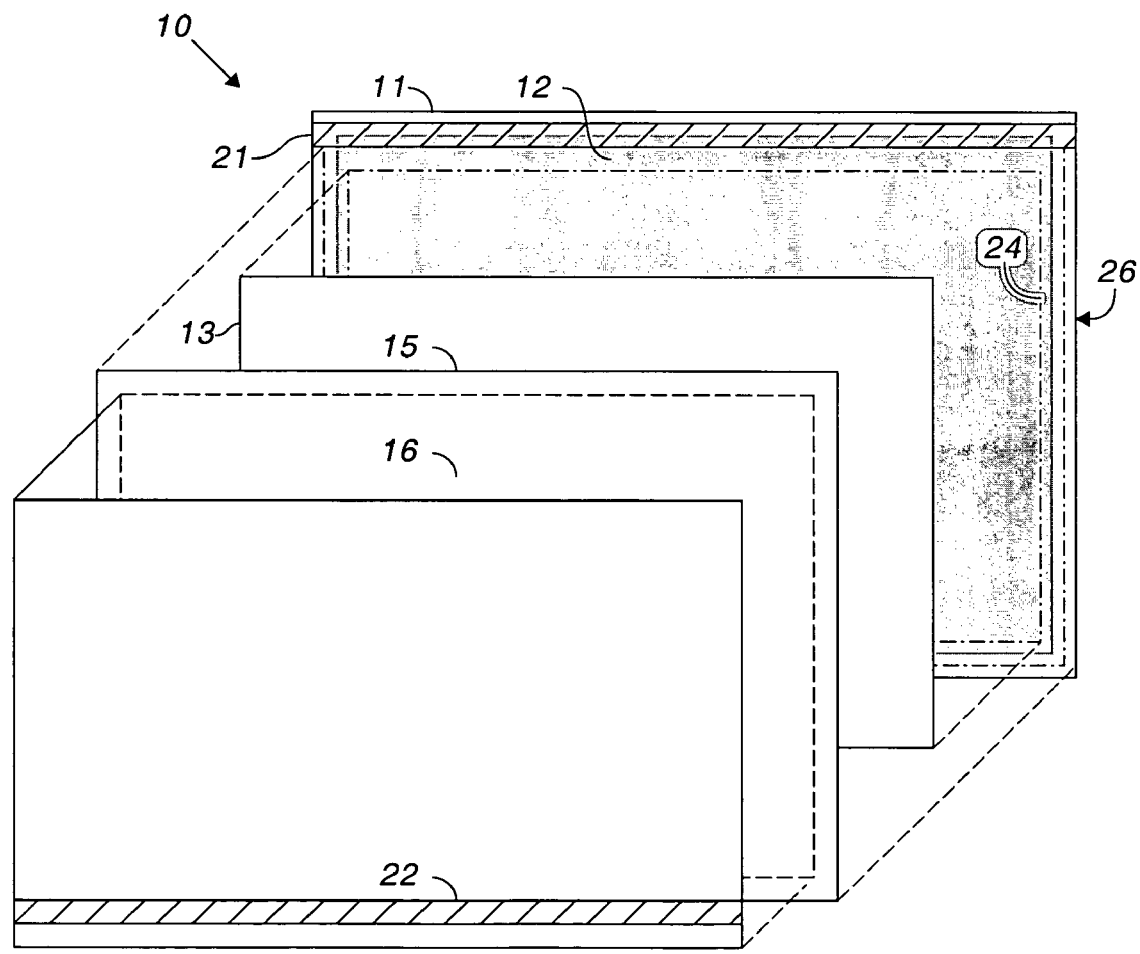
FIG. 2 is an exploded view of an EL lamp.

FIG. 2 is an exploded view of lamp 10. Substrate 11 is coated on the side facing the viewer by electrode 12, which may or may not completely cover the substrate. Phosphor layer 13 is smaller in area than electrode 12 and defines the lit area of the lamp. Specifically, there is typically a small margin or border around the perimeter of phosphor layer 13 on substrate 11. Dielectric layer 15 is larger in area than phosphor layer 13 and extends slightly into the margin to isolate front electrode 12 from rear electrode 16. Rear electrode 16 is typically smaller in area than dielectric layer 15. Bus bar 21 provides a low resistance contact to front electrode 12 and bus bar 22 provides a low resistance contact to rear electrode 16. The bus bars can be located along the same edge of lamp.

As illustrated in FIG. 2, the margin along the right hand edge of lamp 10 extends from dashed line 24 to right hand edge 26. The margin continues around the perimeter of lamp 10. In accordance with one aspect of the invention, the margin along one edge of a first lamp is trimmed and the margin of a second lamp overlaps the first lamp along that edge, thereby joining the lit areas of the lamps. Because an EL lamp is a diffuse light source, the trimming need not be precisely along line 24. A small gap between lit areas is not noticeable at normal viewing distances. Cutting into a lit area obviously makes the combined lit areas smaller.

Figure 3:
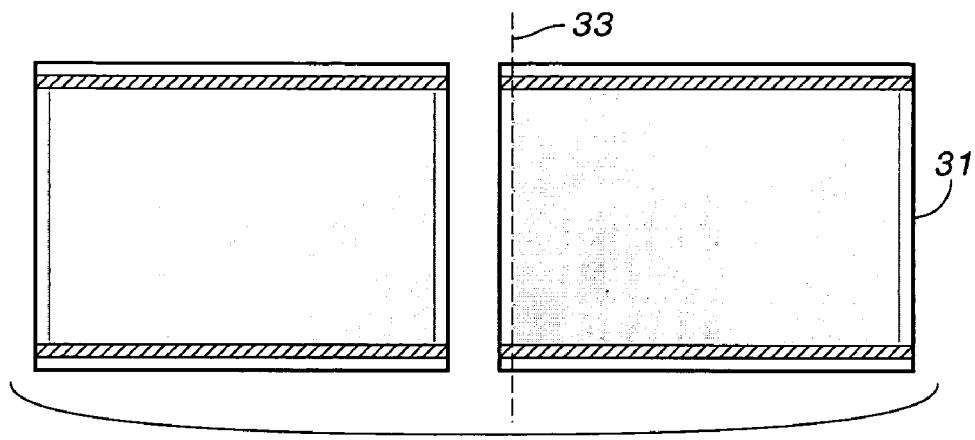
FIG. 3 illustrates trimming the non-luminous area from one edge of an EL lamp.
Figure 4:
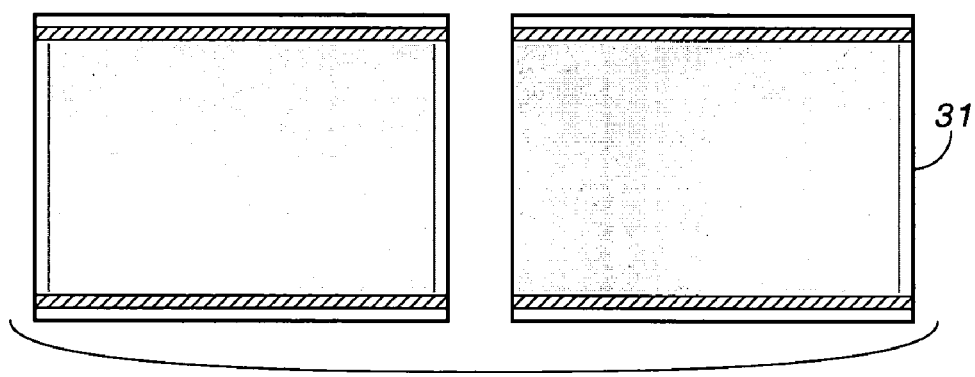
FIG. 4 illustrates positioning a trimmed lamp next to another EL lamp.
Figure 5:
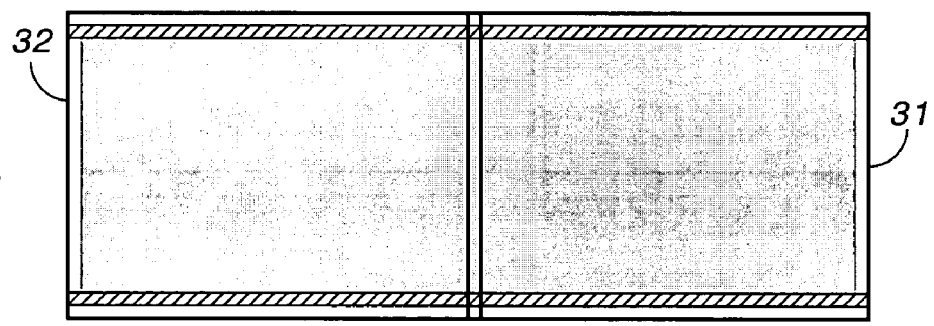
FIG. 5 illustrates overlapping the non-luminous edge of an EL lamp with a trimmed EL lamp.

The method for joining two or more lamps is illustrated in FIGS. 3-5. In FIG. 3, EL lamp 31 is cut along line 33, producing the result illustrated in FIG. 4. EL lamp 31 is then place over the right hand margin of EL lamp 32 and joined to lamp 32. The lamps can be joined by tape, pressure sensitive adhesive, solvent adhesive, UV cured resin or other means.

Figure 6:
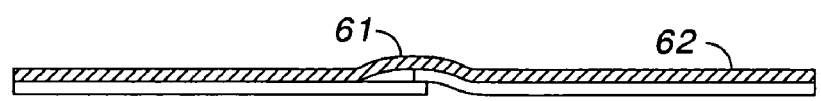
FIG. 6 is a cross-section illustrating applying conductive tape to the bus bars of the EL lamps in FIG. 5.

FIG. 6 illustrates the final step in the method wherein conductive tape 61 joins the respective bus bars of the EL lamps, connecting the lamps in parallel. That is, a first strip of tape connects the rear electrodes together and a second strip of tape connects the front electrodes together. The lamps could be connected anti-parallel (front to rear and rear to front) but this is not preferred. "Parallel" is intended to cover either connection. As indicated by reference number 62, the tape extends across the backs of the lamps, rather than just across the joint, to provide adequate current carrying capability for very long lamps (several lamps joined on their sides). Suitable tape includes 3M® 1170™ smooth aluminum tape or 1181™ copper foil tape, and any metallized mesh or woven metal mesh tape. Whatever tape is used must have an adhesive with z-axis conductivity; i.e., the adhesive must be conductive in a direction through its thickness.

Also for very long lamps, it is necessary that at least the front electrode have a bus bar overlying the front electrode under the conductive tape. Preferably, the rear electrode also has a bus bar underlying the conductive tape. Failure to provide a bus bar or to run the tape continuously across the backs of all lamps could result in "hot spots", localized heating from too much current and too little conductivity.

Another lamp can be attached to the right hand side of EL lamp 31. Actually, the lamps can be added on either side to make as wide a lamp as desired. If an EL lamp had electrodes along only one side, then additional EL lamps could be attached to the remaining three sides. The EL lamps to be joined can have any desired shape, although overlapping straight edges obviously simplify joining the lamps.

The invention thus provides a substantially seamless, large EL panel and, in particular, provides a screen printed EL lamp having an area larger than the work area of a single screen printer. A method for attaching one EL lamp to another is also provided.

Having thus described the invention, it will be apparent to those skilled in the art that many modifications can be made with the scope of the invention.

What is claimed as the invention is:

1. An EL panel comprising: at least two EL lamps, a first of said lamps having an unlit margin along one edge thereof and a second of said lamps having a lit area extending to an edge of said second lamp; wherein the lit edge of the second lamp overlaps the unlit margin of the first lamp and is mechanically joined to the first EL lamp along the unlit margin; said EL lamps each including at least two bus bars intersecting the margin and said panel further including conductive tape electrically connecting said EL lamps in parallel across the intersections at the margin; whereby said first EL lamp and said second EL lamp provide a substantially seamless luminous area in said panel.

2. The EL panel as set forth in claim 1 wherein the conductive tape extends continuously across the backs of said at least two lamps.

* * * * *